US009082874B2

(12) United States Patent
Kim et al.

(10) Patent No.: US 9,082,874 B2
(45) Date of Patent: Jul. 14, 2015

(54) SEMICONDUCTOR DEVICE INCLUDING TRANSISTOR AND METHOD OF MANUFACTURING THE SAME

(71) Applicant: Samsung Electronics Co., Ltd., Suwon-si (KR)

(72) Inventors: Dong Hyuk Kim, Seongnam-si (KR); Dongsuk Shin, Yongin-si (KR); Hoi Sung Chung, Hwaseong-si (KR); Naein Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/565,922

(22) Filed: Dec. 10, 2014

(65) Prior Publication Data

US 2015/0140747 A1 May 21, 2015

Related U.S. Application Data

(62) Division of application No. 14/021,469, filed on Sep. 9, 2013, now Pat. No. 8,937,343.

(30) Foreign Application Priority Data

Sep. 21, 2012 (KR) ........................ 10-2012-0105407

(51) Int. Cl.
*H01L 21/336* (2006.01)
*H01L 21/8234* (2006.01)
(Continued)

(52) U.S. Cl.
CPC .. *H01L 21/823437* (2013.01); *H01L 21/02636* (2013.01); *H01L 21/30608* (2013.01); *H01L21/823481* (2013.01); *H01L 29/045* (2013.01); *H01L 21/324* (2013.01); *H01L 29/7834* (2013.01); *H01L 29/7843* (2013.01); *H01L 29/7848* (2013.01)

(58) Field of Classification Search
CPC ............... H01L 21/823437; H01L 21/823481; H01L 21/30608; H01L 21/02636; H01L 29/78; H01L 29/165; H01L 29/6636; H01L 29/7834; H01L 29/7848; H01L 29/045; H01L 29/7843; H01L 21/84; H01L 29/665; H01L 21/324; H01L 21/26586
USPC ......... 438/198, 197, 581, 585, 294, 595, 302; 257/255, 288, 192, E21.092, E21.093
See application file for complete search history.

(56) References Cited

U.S. PATENT DOCUMENTS 6,949,482 B2 9/2005 Murthy et al.
7,538,387 B2 5/2009 Tsai
(Continued)

FOREIGN PATENT DOCUMENTS

JP 2011165859 8/2011
KR 2011093217 8/2011

OTHER PUBLICATIONS

"Semiconductor Device Including Transistor and Method of Manufacturing the Same" Specification, Drawings, Claims and Prosecution History, of U.S. Appl. No. 14/021,469, filed Sep. 9, 2013, by Dong Hyuk Kim, et al.

*Primary Examiner* — Thinh T Nguyen
(74) *Attorney, Agent, or Firm* — Onello & Mello, LLP (57) ABSTRACT

A semiconductor device includes a gate pattern disposed on a semiconductor substrate, a bulk epitaxial pattern disposed in a recess region formed in the semiconductor substrate at a side of the gate pattern, an insert epitaxial pattern disposed on the bulk epitaxial pattern, and a capping epitaxial pattern disposed on the insert epitaxial pattern. The bulk epitaxial pattern has an upper inclined surface that is a {111} crystal plane, and the insert epitaxial pattern includes a specific element that promotes the growth rate of the insert epitaxial pattern on the upper inclined surface.

8 Claims, 4 Drawing Sheets

(51) Int. Cl.
*H01L 29/04* (2006.01)
*H01L 21/306* (2006.01)
*H01L 21/02* (2006.01)
*H01L 21/324* (2006.01)
*H01L 29/78* (2006.01)

(56) References Cited

U.S. PATENT DOCUMENTS

| | | | |
|---|---|---|---|
| 7,652,328 B2 | 1/2010 | Yamasaki et al. | |
| 7,667,227 B2 | 2/2010 | Shimamune et al. | |
| 7,939,891 B2 | 5/2011 | Matsuo et al. | |
| 7,943,969 B2 | 5/2011 | Yang et al. | |
| 8,207,040 B2 | 6/2012 | Chung et al. | |
| 2009/0095992 A1 | 4/2009 | Sanuki et al. | |
| 2009/0184341 A1 | 7/2009 | Chong et al. | |
| 2010/0167486 A1* | 7/2010 | Shin | 438/300 |
| 2011/0201166 A1 | 8/2011 | Chung et al. | |
| 2011/0220964 A1 | 9/2011 | Shin et al. | |
| 2012/0056245 A1 | 3/2012 | Kang et al. | |

* cited by examiner

SEMICONDUCTOR DEVICE INCLUDING TRANSISTOR AND METHOD OF MANUFACTURING THE SAME

CROSS-REFERENCE TO RELATED APPLICATIONS

This application is a divisional application of U.S. patent application Ser. No. 14/021,469, filed Sep. 9, 2013, which claims the benefit of Korean Patent Application No. 10-2012-0105407, filed on Sep. 21, 2012, the entirety of which is incorporated by reference herein.

BACKGROUND

The inventive concept relates to a semiconductor device and a method of manufacturing the same and, more particularly, to a semiconductor device including a transistor and a method of manufacturing the same.

Semiconductor devices are widely used in various industrial fields (e.g., electronic devices, cars, and/or vessels) because of their lightness, small size, and/or low manufacture costs. A field effect transistor (hereinafter, referred to as 'a transistor') is one of the important discrete constituents constituting the semiconductor device. Generally, the transistor may include a source, a drain, and a gate electrode. The source and drain may be spaced apart from each other in a semiconductor substrate and may be formed by implanting dopant ions into the semiconductor substrate. The gate electrode may cover a channel region between the source and drain and may be insulated from the channel region by a gate oxide layer therebetween. The transistor may be used as a switching part and/or as a part constituting a logic circuit when a "turn-on" current is applied.

Recently, operating speeds of the semiconductor devices have been increased. On the other hand, sizes of the transistors have been reduced as semiconductor devices have become highly integrated. Thus, the turn-on current of the transistors is reduced, and performance of the semiconductor device may consequently be deteriorated. Due to the deterioration of the transistor, reliability of the semiconductor device may be deteriorated, and the operating speed of the transistor may be reduced. Accordingly, a variety of research is being conducted for increasing the turn-on current of the transistor.

SUMMARY

Embodiments of the inventive concept may provide a highly integrated semiconductor device and a method of manufacturing the same.

Embodiments of the inventive concept may also provide a semiconductor device capable of reducing a contact resistance and a method of manufacturing the same.

In one aspect, a semiconductor device may include: a gate pattern disposed on a semiconductor substrate; a bulk epitaxial pattern disposed in a recess region formed in the semiconductor substrate at a side of the gate pattern, the bulk epitaxial pattern having an upper inclined surface that is a $\{111\}$ crystal plane of the bulk epitaxial pattern; an insert epitaxial pattern disposed on the bulk epitaxial pattern, the insert epitaxial pattern including a specific element that promotes a growth rate of the insert epitaxial pattern on the upper inclined surface; and a capping epitaxial pattern disposed on the insert epitaxial pattern.

In some embodiments, the semiconductor substrate may be formed of a first semiconductor element; the bulk epitaxial pattern may include a second semiconductor element different from the first semiconductor element; the specific element of the insert epitaxial pattern may be the second semiconductor element; and the concentration of the second semiconductor element in the insert epitaxial pattern may be lower than the concentration of the second semiconductor element in the bulk epitaxial pattern.

In some embodiments, an atomic diameter of the second semiconductor element may be different from an atomic diameter of the first semiconductor element.

In some embodiments, the capping epitaxial pattern may be formed of the first semiconductor element.

In some embodiments, the recess region may include an undercut region tapered toward a channel region under the gate pattern; and inner surfaces of the recess region constituting the tapered undercut region may be included in $\{111\}$ crystal planes of the semiconductor substrate.

In some embodiments, the semiconductor device may further include a device isolation pattern formed in/on the semiconductor substrate and defining an active portion. In this case, the gate pattern may be disposed on the active portion; the recess region may be formed in the active portion at a side of the gate pattern; and a bottom end of the upper inclined surface of the bulk epitaxial pattern may be adjacent to the device isolation pattern.

In some embodiments, the bulk epitaxial pattern may provide a stress to a channel region under the gate pattern.

In some embodiments, a semiconductor device includes a semiconductor substrate including a first semiconductor element and a device isolation pattern that defines an active semiconductor portion of the semiconductor substrate. A gate pattern including a gate electrode is mounted on the active portion of the semiconductor substrate and covers a channel region in the active portion of the semiconductor substrate. At least one recess region is defined in the active portion of the semiconductor substrate between the gate pattern and the device isolation pattern. A bulk epitaxial pattern is formed in the recess region and including an upper surface inclined along a $\{111\}$ crystal plane; an insert epitaxial pattern is formed on the bulk epitaxial pattern and including a second semiconductor element that desorbs hydrogen from the upper inclined surface of the bulk epitaxial pattern; and a capping epitaxial pattern is formed on the insert epitaxial pattern.

In some embodiments of this device, the second semiconductor element is germanium, and the first semiconductor element is silicon. The capping epitaxial pattern can also include silicon. Embodiments of this device can further include an ohmic pattern formed of a metal silicide on the capping epitaxial pattern, an interlayer insulating layer formed on the ohmic pattern and on the gate pattern, an interconnection formed of an electrically conductive pattern on the interlayer insulating layer, and a contact plug formed of an electrically conductive material passing through the interlayer insulating layer and connecting the interconnection and the ohmic pattern.

In another aspect, a method of manufacturing a semiconductor device may include: forming a gate pattern on a semiconductor substrate; forming a recess region in the semiconductor substrate at a side of the gate pattern; forming a bulk epitaxial pattern in the recess region, the bulk epitaxial pattern having an upper inclined surface that is a $\{111\}$ crystal plane of the bulk epitaxial pattern; forming an insert epitaxial pattern on the bulk epitaxial pattern, the insert epitaxial pattern including a specific element that promotes the growth rate of the insert epitaxial pattern on the upper inclined surface; and forming a capping epitaxial pattern on the insert epitaxial pattern.

In some embodiments, the semiconductor substrate may be formed of a first semiconductor element, and the bulk epitaxial pattern may include a second semiconductor element different from the first semiconductor element. The specific element of the insert epitaxial pattern may be the second semiconductor element. In this case, the concentration of the second semiconductor element in the insert epitaxial pattern may be lower than the concentration of the second semiconductor element in the bulk epitaxial pattern.

In some embodiments, the atomic diameter of the second semiconductor element may be different from the atomic diameter of the first semiconductor element.

In some embodiments, the capping epitaxial pattern may be formed of silicon. In this case, a selective epitaxial growth process for the formation of the capping epitaxial pattern may use a process gas including a silicon source gas heavier than silane ($SiH_4$).

In some embodiments, the process gas of the selective epitaxial growth process may include dichlorosilane (DCS, $SiCl_2H_2$).

In some embodiments, the method may further include forming a device isolation pattern in/on the semiconductor substrate to define an active portion. In this case, the gate pattern may be formed on the active portion, and the recess region may be formed in the active portion at a side of the gate pattern. A bottom end of the upper inclined surface of the bulk epitaxial pattern may be adjacent to the device isolation pattern.

In some embodiments, forming the recess region may include performing an anisotropic dry etching process on the semiconductor substrate at a side of the gate pattern to form a concave region and performing an anisotropic wet etching process on the concave region to form the recess region. The anisotropic wet etching process may use {111} crystal planes of the semiconductor substrate as etch stop surfaces.

In some embodiments, the anisotropic wet etching process may use an anisotropic etchant including ammonium hydroxide ($NH_4OH$) and/or tetramethyl ammonium hydroxide (TMAH).

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element, such as a layer, region or substrate, is referred to as being "on" another element, it can be directly on the other element or intervening elements may be present. In contrast, the term, "directly", means that there are no intervening elements. It will be further understood that the terms, "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties and are used to illustrate specific shapes of elements. Thus, this embodiment should not be construed as limiting the scope of the inventive concept.

It will be also understood that although the terms, first, second, third, etc., may be used herein to describe various elements, these elements should not be limited by these terms. Rather, these terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limiting the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1 to 5 are cross-sectional views illustrating a semiconductor device at various stages in a method of manufacturing the semiconductor device according to example embodiments of the inventive concept.

Figure 1:
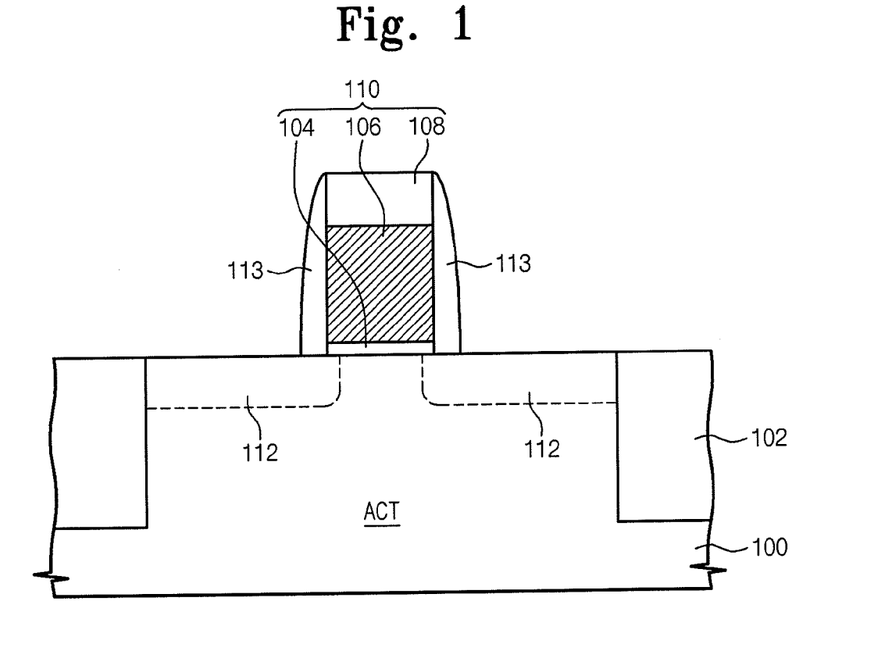
FIGS. 1 to 5 are cross-sectional views illustrating a semiconductor device at various stages of its manufacture according to example embodiments of the inventive concept.

Referring to FIG. 1, a device isolation pattern 102 may be formed on/in a semiconductor substrate 100 (e.g., by depositing silicon dioxide via chemical and/or plasma deposition) to define an active portion ACT. The semiconductor substrate 100 may be formed of a first semiconductor element. For example, the first semiconductor element may be silicon. The active portion ACT corresponds to a portion of the semiconductor substrate 100 surrounded by the device isolation pattern 102. The active portion ACT may be doped with dopants of a first conductivity type.

A gate pattern 110 may be formed on the active portion ACT. The gate pattern 110 may include a gate insulating layer 104, a gate electrode 106, and a capping insulating pattern 108, which are sequentially stacked on the active portion ACT. The gate insulating layer 104 may include at least one of an oxide, a nitride, an oxynitride, and a high-k dielectric material. The gate electrode 106 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide). The capping insulating pattern 108 may include at least one of an oxide, a nitride, and an oxynitride.

Low-concentration doped regions 112 may be formed in the active portion ACT at both sides of the gate pattern 110, respectively. The low-concentration doped regions 112 may be doped with dopants of a second conductivity type. One of the first and second conductivity types is an N-type, and the other of the first and second conductivity types is a P-type.

Gate spacers 113 may be formed on both sidewalls of the gate pattern 110, respectively. The gate spacers 113 may be formed of an insulating material (for example, an oxide, a nitride, and/or an oxynitride).

Figure 2:
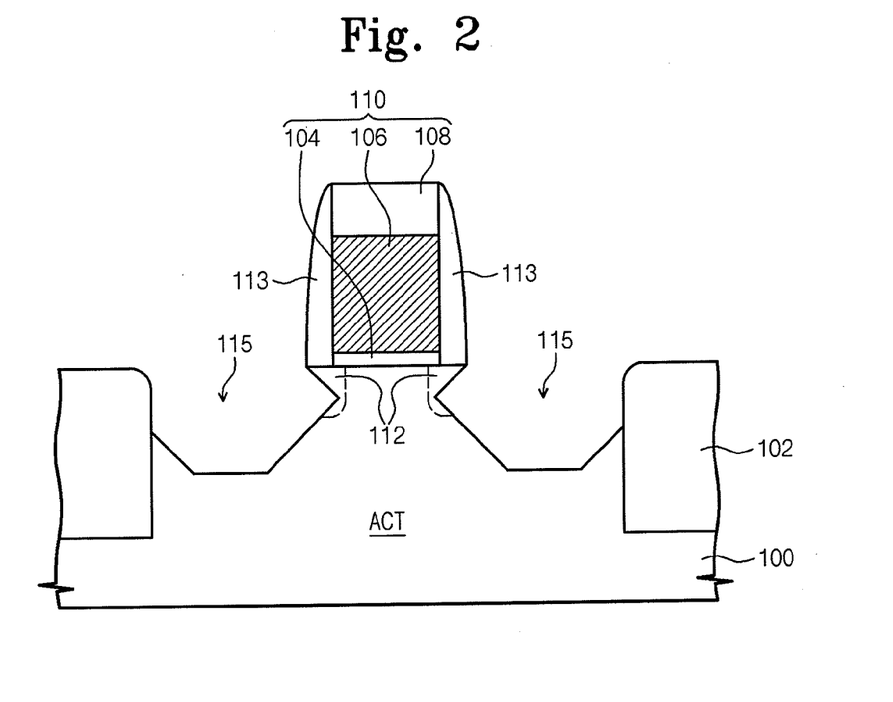

Referring to FIG. 2, recess regions 115 may be formed in the active portion ACT at both sides of the gate pattern 110, respectively. An inner surface of each of the recess regions 115 may include {111} crystal planes of the semiconductor substrate 100. In some embodiments, an anisotropic dry etching process may be performed on the active portion ACT at both sides of the gate pattern 110 to form concave regions. Next, an anisotropic wet etching process may be performed on the concave regions to form the recess regions 115. The anisotropic wet etching process may use the {111} crystal planes of the semiconductor substrate 100 as etch stop surfaces. If the semiconductor substrate 100 is a silicon substrate, the anisotropic wet etching process may use an anisotropic etchant including ammonium hydroxide ($NH_4OH$) and/or tetramethyl ammonium hydroxide (TMAH).

Figure 3:
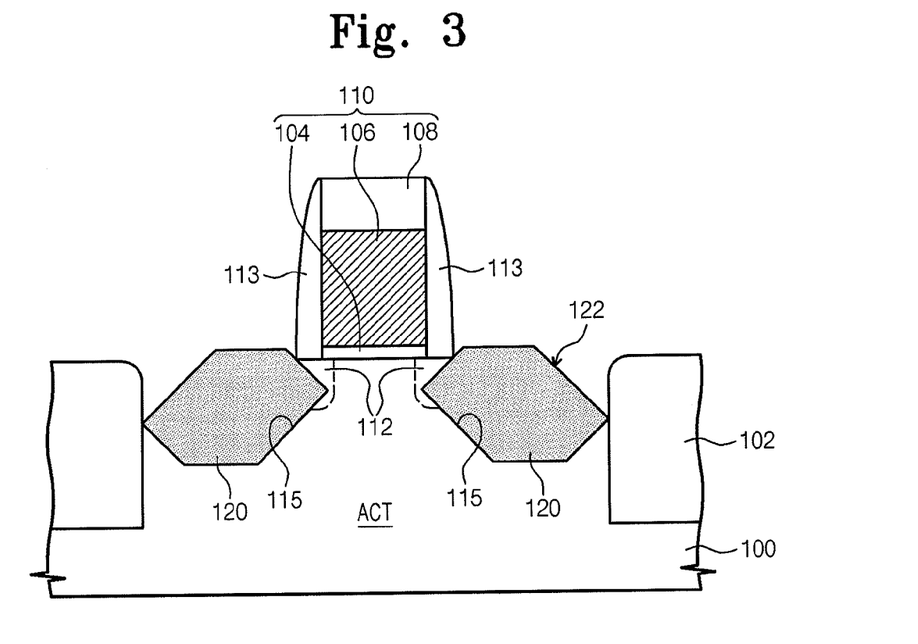

Referring to FIG. 3, a first selective epitaxial growth process may be performed to form bulk epitaxial patterns 120 in the recess regions 115, respectively. The bulk epitaxial patterns 120 may include a second semiconductor element different from the first semiconductor element. The atomic diameter of the second semiconductor element is different from the atomic diameter of the first semiconductor element. Thus, the bulk epitaxial patterns 120 may provide a stress to a channel region under the gate pattern 110. The bulk epitaxial patterns 120 may further include the first semiconductor element.

If a transistor including the gate pattern 110 is a positive-metal-oxide-semiconductor (PMOS) transistor, the second semiconductor element may be germanium (Ge). For example, the bulk epitaxial patterns 120 may include silicon-germanium (SiGe). Thus, the bulk epitaxial patterns 120 may provide a compressive stress to the channel region so that the mobility of holes may be improved in the channel region. If the transistor is a negative-metal-oxide-semiconductor (NMOS) transistor, the second semiconductor element may be carbon. For example, the bulk epitaxial patterns 120 may include silicon carbide (SiC). Thus, the bulk epitaxial patterns 120 may provide a tensile stress to the channel region so that the mobility of electrons may be improved in the channel region.

The bulk epitaxial pattern 120 may include an upper inclined surface 122 being one of the {111} crystal planes of the bulk epitaxial patterns 120. A bottom end of the upper inclined surface 122 may be adjacent to the device isolation pattern 102. In some embodiments, the bottom end of the upper inclined surface 122 may be in contact with the device isolation pattern 102, as illustrated in FIG. 3. An area of the upper inclined surface 122 may be increased by the device isolation pattern 102.

The bulk epitaxial patterns 120 may be doped with dopants of the second conductivity type. The bulk epitaxial patterns 120 may be doped by an in-situ method or by an ion implantation method.

Figure 4:
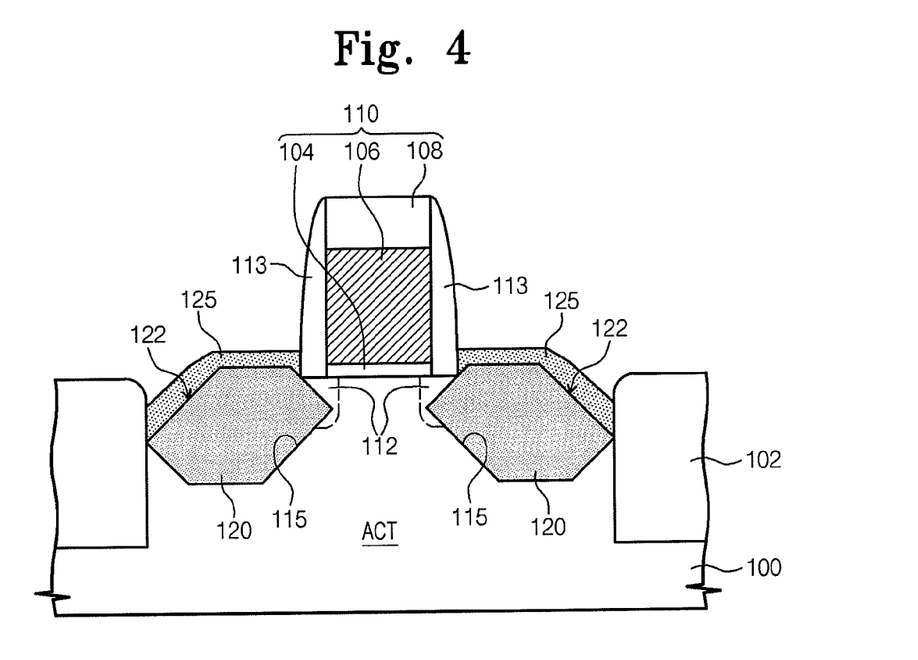

Referring to FIG. 4, a second selective epitaxial growth process may be performed to form insert epitaxial patterns 125 on the bulk epitaxial patterns 120, respectively. The insert epitaxial pattern 125 includes a specific element that promotes the growth rate of the insert epitaxial pattern 125 on the upper inclined surface 122 of the bulk epitaxial pattern 120. Thus, the insert epitaxial pattern 125 may be formed to have a sufficient thickness on the upper inclined surface 122.

In some embodiments, the specific element of the insert epitaxial pattern 125 may be the second semiconductor element. The concentration of the second semiconductor element in the insert epitaxial pattern 125 may be lower than the concentration of the second semiconductor element in the bulk epitaxial pattern 120. For example, if the semiconductor substrate 100 is a silicon substrate and the bulk epitaxial pattern 120 includes silicon-germanium (SiGe), the insert epitaxial pattern 125 may include germanium (Ge). The germanium (Ge) may act as a hydrogen desorption center of the upper inclined surface 122 of the bulk epitaxial pattern 125 so that the growth rate of the insert epitaxial pattern 125 may be promoted on the upper inclined surface 122. In some embodiments, the insert epitaxial pattern 125 may further include the first semiconductor element. For example, the insert epitaxial pattern 125 may include silicon-germanium (SiGe). The insert epitaxial pattern 125 may be doped with dopants of the second conductivity type by an in-situ method or by an ion implantation method.

Since the growth rate of the insert epitaxial pattern 125 is promoted on the upper inclined surface 122, it is possible to supplement a volume reduction of the bulk epitaxial pattern that is caused by the area increase of the upper inclined surface 122.

Figure 5:
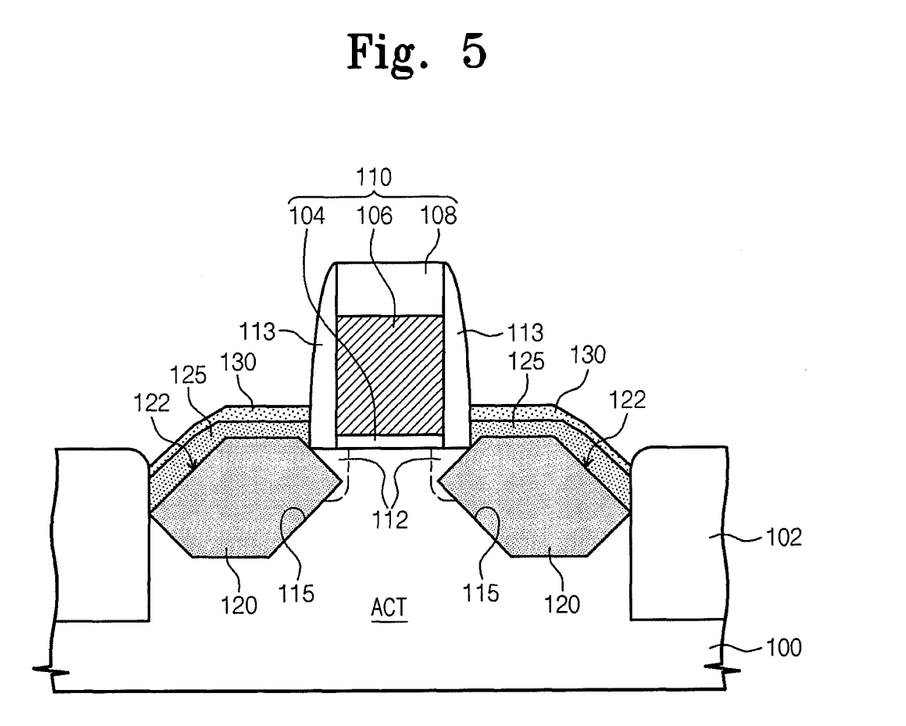

Referring to FIG. 5, a third selective epitaxial growth process may be performed to form capping epitaxial patterns 130 on the insert epitaxial patterns 125, respectively. The capping epitaxial patterns 130 may be formed of the first semiconductor element. For example, the capping epitaxial patterns 130 may be formed of silicon.

In some embodiments, the third selective epitaxial growth process may use a process gas including a silicon source gas heavier than silane ($SiH_4$). For example, the silicon source gas of the third selective epitaxial growth process may include dichlorosilane (DCS, $SiCl_2H_2$). For example, the silicon source gas of the third selective epitaxial growth process may include only DCS, or a mixture gas of DCS and silane.

Since the process gas of the third selective epitaxial growth process includes the relatively heavy silicon source gas, the relatively heavy silicon source gas may be accumulated at a boundary region between the device isolation pattern 102 and the bulk and insert epitaxial patterns 120 and 125. Thus, a growth rate of a (110) crystal plane of the capping epitaxial pattern 130 may be improved.

The area of a substantially flat top surface of the capping epitaxial pattern 130 may be increased by the insert epitaxial pattern 125. Additionally, the area of the substantially flat top surface of the capping epitaxial pattern 130 may be further increased because the process gas of the third selective epitaxial growth process includes the relatively heavy silicon source gas. As a result, an overlapping area of the capping epitaxial pattern 130 and a contact plug formed in a subsequent process may be increased to reduce the contact resistance.

Figure 6:
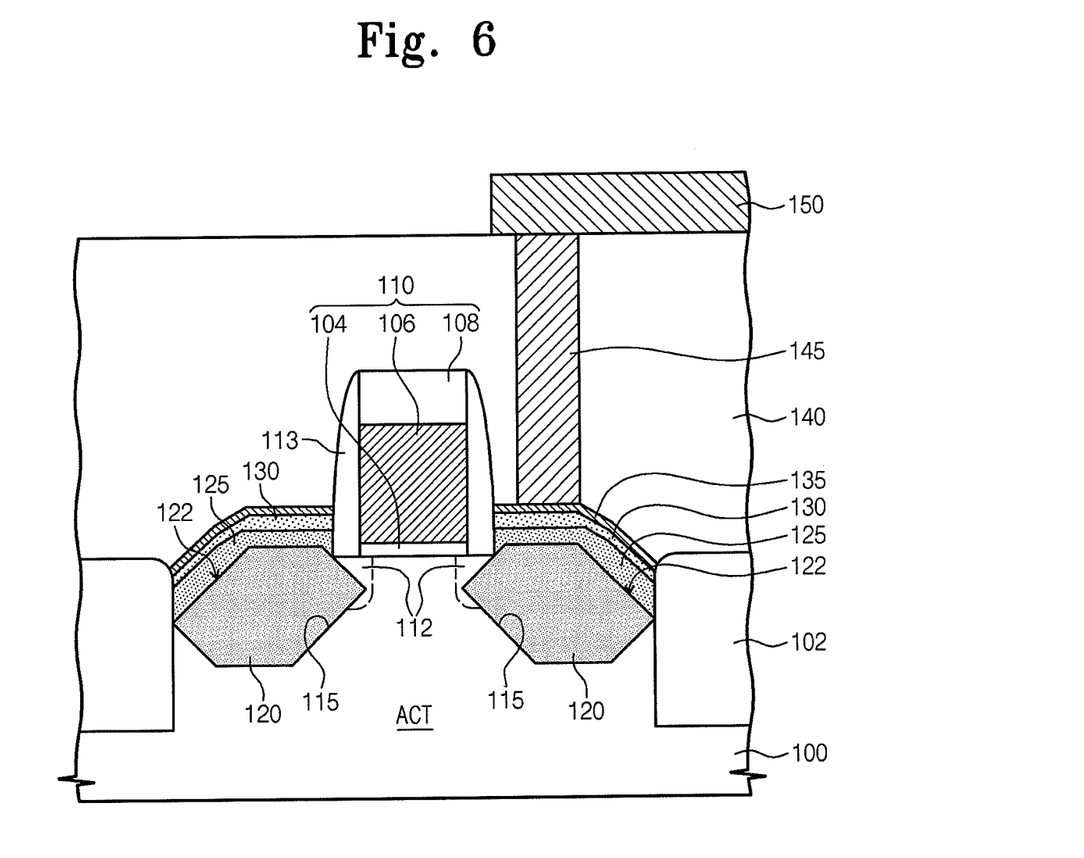
FIG. 6 is a cross-sectional view illustrating a semiconductor device according to example embodiments of the inventive concept.

Subsequently, ohmic patterns 135, an interlayer insulating layer 140, a contact plug 145 (formed of a conductive material, such as tungsten), and an interconnection 150, as shown in FIG. 6, may be formed (e.g., of an electrically conductive metal) to produce the semiconductor device. The ohmic patterns 135 may comprise a metal silicide formed by a silicide process.

FIG. 6 is a cross-sectional view illustrating a semiconductor device according to example embodiments of the inventive concept. For the purpose of ease and convenience in explanation, the descriptions described above will be omitted or mentioned briefly.

Referring to FIG. 6, the gate pattern 110 may be disposed on the active portion ACT defined by the device isolation pattern 102. The gate spacers 113 may be disposed on both sidewalls of the gate pattern 110, respectively. The bulk epitaxial patterns 120 may be disposed in the recess regions 115 formed in the active portion ACT at both sides of the gate pattern 110, respectively. Each of the recess regions 115 may include an undercut region tapered toward the channel region under the gate pattern 110, and the bulk epitaxial pattern 120 may fill the tapered undercut region. Inner surfaces of the recess region 115 constituting the tapered undercut region may be included in {111} crystal planes of the semiconductor substrate 100.

Each of the bulk epitaxial patterns 120 includes the upper inclined surface 122 as one of the {111} crystal planes of the bulk epitaxial pattern 120. An insert epitaxial pattern 125 is disposed on each of the bulk epitaxial patterns 120. The insert epitaxial patterns 125 include the specific element that promotes the growth rate of the insert epitaxial pattern 125 on the upper inclined surface 122; and the insert epitaxial patterns 125 are in contact with the upper inclined surfaces 122 of the bulk epitaxial patterns 120, respectively.

The capping epitaxial patterns 130 may be disposed on the insert epitaxial patterns 125, respectively. The ohmic patterns 135 may be disposed on the capping epitaxial patterns 130, respectively, and may be formed by reaction of a metal and the first semiconductor element of the capping epitaxial pattern 130.

The interlayer insulating layer 140 may be disposed on an entire surface of the semiconductor substrate 100 including the gate pattern 110 and the ohmic patterns 135. The contact plug 145 may penetrate the interlayer insulating layer 140 and may be connected to the ohmic pattern 125. The interconnection 150 may be disposed on the interlayer insulating layer 140 and may be connected to the contact plug 145.

As described above, the insert epitaxial pattern includes the specific element that promotes the growth rate of the insert epitaxial pattern on the upper inclined surface. Thus, the growth rate of the insert epitaxial pattern is promoted on the upper inclined surface, thereby supplementing the volume reduction of the bulk epitaxial pattern caused by the area increase of the upper inclined surface. Additionally, the area of the substantially flat top surface of the capping epitaxial pattern can increase to reduce the contact resistance between the capping epitaxial pattern (or the ohmic pattern) and the contact plug. As a result, a highly integrated semiconductor device may be realized.

Furthermore, the selective epitaxial growth process for the capping epitaxial pattern uses the relatively heavy silicon source gas so that the growth rate of the (110) crystal plane of the capping epitaxial pattern can increase. As a result, the area of the substantially flat top surface of the capping epitaxial pattern may further increase.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents and shall not be restricted or limited by the foregoing description.

What is claimed is:

1. A method of manufacturing a semiconductor device, the method comprising:
    forming a gate pattern on a semiconductor substrate;
    forming a recess region in the semiconductor substrate at a side of the gate pattern;
    forming a bulk epitaxial pattern in the recess region, the bulk epitaxial pattern having an upper inclined surface that is a {111} crystal plane of the bulk epitaxial pattern;
    forming an insert epitaxial pattern on the bulk epitaxial pattern, the insert epitaxial pattern including a specific element that promotes a growth rate of the insert epitaxial pattern on the upper inclined surface; and
    forming a capping epitaxial pattern on the insert epitaxial pattern.

2. The method of claim 1, wherein the semiconductor substrate is formed of a first semiconductor element,
    wherein the bulk epitaxial pattern includes a second semiconductor element that is different from the first semiconductor element,
    wherein the specific element of the insert epitaxial pattern is the second semiconductor element, and
    wherein a concentration of the second semiconductor element in the insert epitaxial pattern is lower than a concentration of the second semiconductor element in the bulk epitaxial pattern.

3. The method of claim 2, wherein the second semiconductor element has an atomic diameter that is different from an atomic diameter of the first semiconductor element.

4. The method of claim 1, wherein the capping epitaxial pattern is formed of silicon, and
    wherein a selective epitaxial growth process for the formation of the capping epitaxial pattern uses a process gas including a silicon source gas that is heavier than silane ($SiH_4$).

5. The method of claim 4, wherein the process gas of the selective epitaxial growth process includes dichlorosilane (DCS, $SiCl_2H_2$).

6. The method of claim 1, further comprising:
    forming a device isolation pattern in or on the semiconductor substrate to define an active portion,
    wherein the gate pattern is formed on the active portion, wherein the recess region is formed in the active portion at a side of the gate pattern, and wherein a bottom end of the upper inclined surface of the bulk epitaxial pattern is adjacent to the device isolation pattern.

7. The method of claim 1, wherein forming the recess region comprises:
   performing an anisotropic dry etching process on the semiconductor substrate at a side of the gate pattern to form a concave region; and
   performing an anisotropic wet etching process on the concave region to form the recess region,
   wherein the anisotropic wet etching process uses {111} crystal planes of the semiconductor substrate as etch stop surfaces.

8. The method of claim 7, wherein the anisotropic wet etching process uses an anisotropic etchant including ammonium hydroxide ($NH_4OH$) and/or tetramethyl ammonium hydroxide (TMAH).

* * * * *